(12) United States Patent
Hackner et al.

(10) Patent No.: US 9,742,427 B2
(45) Date of Patent: Aug. 22, 2017

(54) ELECTRICAL CIRCUIT

(71) Applicant: Fraunhofer-Gesellschaft zur Foerderung der angewandten Forschung e.V., Munich (DE)

(72) Inventors: Michael Hackner, Hemau OT Haag (DE); Hans-Peter Hohe, Heilgenstadt (DE); Markus Sand, Taennesberg (DE)

(73) Assignee: FRAUNHOFER-GESELLSCHAFT ZUR FOERDERUNG DER ANGEWANDTEN FORSCHUNG E.V. (DE)

( * ) Notice: Subject to any disclaimer, the term of this patent is extended or adjusted under 35 U.S.C. 154(b) by 0 days.

(21) Appl. No.: 15/151,236

(22) Filed: May 10, 2016

(65) Prior Publication Data

US 2016/0254823 A1  Sep. 1, 2016

Related U.S. Application Data

(63) Continuation of application No. PCT/EP2014/074628, filed on Nov. 14, 2014.

(30) Foreign Application Priority Data

Nov. 15, 2013 (DE) .................. 10 2013 223 394

(51) Int. Cl.
| | |
|---|---|
| *H03M 3/02* | (2006.01) |
| *H03M 3/00* | (2006.01) |
| *H03M 1/12* | (2006.01) |
| *H03M 1/82* | (2006.01) |
| *H03M 7/30* | (2006.01) |
| *H03L 7/08* | (2006.01) |
| *H03M 1/50* | (2006.01) |

(52) U.S. Cl.
CPC ............... *H03M 3/39* (2013.01); *H03L 7/08* (2013.01); *H03M 1/1255* (2013.01); *H03M 1/82* (2013.01); *H03M 3/462* (2013.01); *H03M 3/496* (2013.01); *H03M 7/3004* (2013.01); *H03M 1/50* (2013.01); *H03M 3/50* (2013.01)

(58) Field of Classification Search
CPC ......... H03L 7/08; H03M 3/462; H03M 3/496; H03M 1/82; H03M 7/3004; H03M 1/1255; H03M 3/50
USPC .................................................. 341/143, 120
See application file for complete search history.

(56) References Cited

U.S. PATENT DOCUMENTS

| | | | | |
|---|---|---|---|---|
| 7,450,046 B2 * | 11/2008 | Tada | ..................... | H03M 3/474 |
| | | | | 341/143 |
| 8,228,221 B2 * | 7/2012 | Lai | .......................... | H03M 3/38 |
| | | | | 341/118 |
| 8,749,414 B2 * | 6/2014 | Cho | ........................ | H03M 3/38 |
| | | | | 341/120 |
| 9,007,242 B2 * | 4/2015 | Lin | ....................... | H03M 3/368 |
| | | | | 341/118 |

* cited by examiner

*Primary Examiner* — Brian Young
(74) *Attorney, Agent, or Firm* — Haynes and Boone, LLP

(57) ABSTRACT

An electrical circuit includes a signal processing chain and a controller. The signal processing chain includes an integrator configured to integrate an input signal over an integration time. The controller is connected to a signal output of the signal processing chain to receive and evaluate an output signal of the signal processing chain. The controller is further configured to adapt the integration time based on the output signal.

16 Claims, 4 Drawing Sheets

ELECTRICAL CIRCUIT

CROSS-REFERENCE TO RELATED APPLICATIONS

This application is a continuation of copending International Application No. PCT/EP2014/074628, filed Nov. 11, 2014, which is incorporated herein by reference in its entirety, and additionally claims priority from German Application No. DE 10 2013 223 394.9, filed Nov. 15, 2013, which is incorporated herein by reference in its entirety.

BACKGROUND OF THE INVENTION

Embodiments of the present invention relate to an electrical circuit for signal processing and a method for signal processing.

A signal processing may, for example, be understood as an analog-to-digital conversion or a digital-to-analog conversion but also as a digital-to-digital conversion. A circuit technology often used in analog-to-digital converters and digital-to-analog converters is based on the so-called delta-sigma modulation (DSM). To avoid unwanted effects in sigma-delta converters, like cyclic repetitions of the output pattern, they are operated with a reset between the measurement values (i.e. incrementally), for example. Further, in FFT (fast Fourier transformation) so-called leakage effects may occur when a signal of the FFT is considered to be periodic but no integer number of periods of the signal is included in the time window considered.

There are different approaches to avoid these effects. According to a first approach, time weighting of window functions is applied, which has the tendency to only attenuate the side lines but not to (systematically) avoid them. A further approach is based on the synchronization of system frequencies relative to a reference frequency using a phase-locked loop (PLL), for example. One application example is measurement technology. PLLs are used in measurement technology to adapt the sampling rate (rate of pickup of measurement values) to a defined period of a periodic signal to be measured, for example. In detail, the system frequency or sampling frequency, of a controlled oscillator is adapted to the signal to be measured with the aid of the phase-locked loop such that sampling rate to reference frequency synchronization is accomplished by means of the PLLs.

The Patent Application DE 2012 003909 concerns sigma-delta-analog-to-digital converters in which an integrator adds up decimated sampling values over a predetermined number of decimation sampling values. Upon triggering by the integration counter, the integration value obtained through the integration over the predetermined number of decimation sampling rates is transferred to the integrator output shadow, the integrator is reset and the integration starts anew.

Below, this mechanism will be explained on the basis of an example in combination with the resulting drawbacks. In an alternating voltage three-phase system, the electrical quantities current and voltage are to be measured. The measurement is to be accomplished with a common sampling rate or measurement rate of $2^6$=64 measurement values per period, since measurement rates of this scale also allow for a very efficient fast Fourier transformation algorithm (FFT algorithm). It is assumed that the system clock of the measurement setup is in the range of about 8 MHz to be able to ideally operate the sigma-delta modulation used for the analog-to-digital conversion. Regarding technical implementation, a PLL may be used here, which takes every 64th sampling value as representation of the phase error. If, for example, the phase of the controlled oscillator lags behind, e.g. because the output frequency is too low, a sampling value >0 results. In the reverse case, when the phase is leading, the sampling rate is <0. These deviations from the set point "0" may be detected through the determination of the phase error so that a respective correction is possible. However, the drawback here is that especially in applications on supply mains with low frequencies (50 Hz, 60 Hz or 16⅔ Hz), a high division factor between system clock (8 MHz) and reference clock (50 Hz, 60 Hz or 16⅔ Hz) results. Depending on the application, it is in the range of 1.3×105 (8 MHz/60 Hz) and 4.8×105 (8 MHz/16.7 Hz). As a result, the regulation may become very slow, while, on the other hand, an even more finely resolved frequency setting has to be allowed by the controllable oscillator, which does not let the regulator deviation become too large from one phase comparison to a next. However, such finely adjustable oscillators have a high need for space and power. Therefore, there is need for an improved approach.

It is the object of the present invention to provide a concept for efficient readjustment of a signal processing chain without a controllable oscillator.

SUMMARY

According to an embodiment, an electrical circuit may have a signal processing chain including an integrator configured to integrate an input signal over an integration time; and a controller connected to a signal output of the signal processing chain to receive and evaluate an output signal of the signal processing chain and configured to adapt the integration time based on the output signal.

According to another embodiment, a method for signal processing may have the steps of: integrating an input signal over an integration time by means of a signal processing chain which includes an integrator; receiving and evaluating an output signal of the signal processing chain; and adapting the integration time based on the output signal.

Another embodiment may have a non-transitory digital storage medium having a computer program stored thereon to perform a method for signal processing having the steps of: integrating an input signal over an integration time by means of a signal processing chain which comprises an integrator; receiving and evaluating an output signal of the signal processing chain; and adapting the integration time based on the output signal, when said computer program is run by a computer.

Embodiments of the present invention provide an electrical circuit comprises a signal processing chain and a controller. The signal processing chain, e.g. the signal processing chain of an analog-to-digital converter, includes at least an integrator (analog or digital) configured to integrate an input signal over an integration time. The (integrated) output signal of the signal processing chain is received and evaluated (e.g. regarding phase errors) by the controller connected to the signal output of the signal processing chain. The controller is further configured to adapt the integration time based on the output signal (or the evaluation of the output signal) to be able to achieve, in consideration of the division factor explained above, good synchronization between the integration time and a fundamental wave of the input signal (e.g. synchronous operation with a maximum deviation of 3% or 1% or even 0.1%).

Thus, the essence of the present invention is that, according to the novel concept, the system frequency (oversampling frequency) is no longer tracked by a controllable oscillator and regulation of the phase (PLL) of the fundamental frequency of the input signal but, instead, the number of system clocks which enter into a measurement interval (one measurement interval per measurement value) is adapted (and consequently the effective duration of the measurement interval). The adaptation of the effective duration of the measurement interval to the fundamental frequency of the input signal is accomplished by varying the integration time of the integrator, which is part of the signal processing chain. This offers the essential advantage that the system clock frequency may remain stable. A constant system clock frequency has a positive effect on digital signal processing blocks in particular, which are operated through the system clock, so that they may be designed with low requirements, e.g. regarding the setup times, since tolerances of the signal frequency do not have to be considered. Consequently, the controllable oscillator is no longer required so that the circuit may be realized with a very small (chip) area and thus with low manufacturing costs. Furthermore, positive effects regarding power consumption and temperature or process dependability, may also be observed.

According to an embodiment, the signal processing chain comprises a sigma-delta modulator which corresponds to at least the order 1. The sigma-delta modulator may be configured to provide a digital output signal based on an analog input signal. Because now only the integration duration of the integrator of the sigma-delta modulator is varied and the system clock remains constant, the sigma-delta modulator may be operated at the ideal operating point of its clock frequency. As a result, a layout for larger frequency differences is no longer necessary.

According to embodiments, the signal processing chain may include a filter or also a decimation filter on the output side, but it is to be noted that, according to a further embodiment, the decimation filter may comprise the integrator of the signal processing chain.

Further, in such a digital output stage, a division formation element configured to divide the output signal of the signal processing chain by the integration time to output the division value as a result may also be provided on the output side. This offers the advantage that scaling effects may directly be compensated as a result of the variation of the integration time.

According to further embodiments, a phase discriminator (e.g. a sample and hold member as phase discriminator) may be provided on the output side configured to evaluate the output signal regarding phase errors and to adapt the integration time based on the evaluation to reduce or minimize, the phase error. According to further embodiments, the control of the integration time is accomplished such that the period of the fundamental wave of the input signal is an integer multiple of the mean integration time. The background of this is that, for a very fine setting of the period, the measurement duration is minimally varied in between so that the period of the signal is not only between N and N+1 or N−1 times the integration time for a measurement value, but may be of a significantly finer resolution.

Embodiments provide a method for signal processing. The method includes at least the steps of "integrating an input signal over an integration time" by means of a signal processing chain, which includes an integrator, "receiving and evaluating an output signal" of the signal processing chain as well as "adapting the integration time" based on the output signal.

BRIEF DESCRIPTION OF THE DRAWINGS

Embodiments of the present invention will be described subsequently referring to the appended drawings, in which:

FIG. 1b shows a schematic flow chart of the method for operating the signal processing device shown in FIG. 1a;

DETAILED DESCRIPTION OF THE INVENTION

Before embodiments of the present invention will be discussed below in detail with reference to the accompanying figures, it is to be noted that elements or structures of equal effect are denoted with the same reference numbers so that the description thereof is mutually applicable and exchangeable.

Figure 1A:
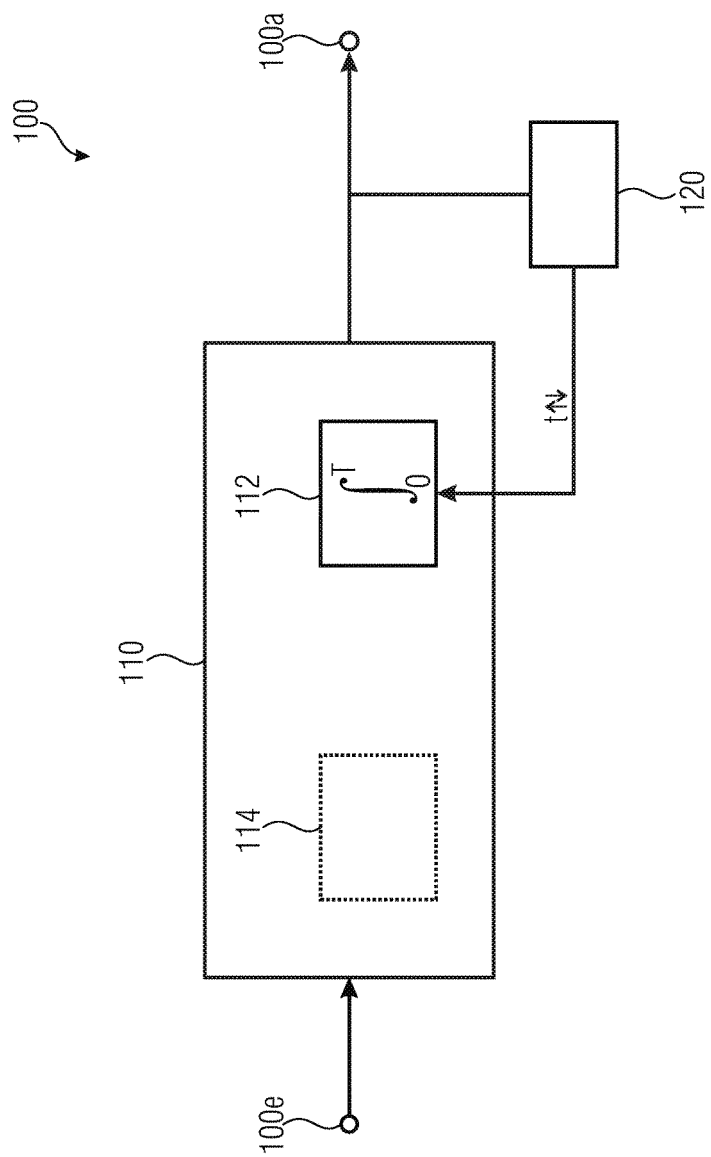
FIG. 1a shows a schematic block circuit diagram of an electrical circuit with a signal processing device and a controller according to a first embodiment.

FIG. 1a shows an electrical circuit 100 comprising an integrating signal processing chain 110 and a controller 120. The signal processing chain 110 also includes at least an integrator 112 connected directly to an input 100e of the signal processing chain 110 or through an optional circuit element 114, such as, e.g., a comparator of a sigma-to-delta converter. The integrator 112 may alternatively also be part of a circuit element of the signal processing chain 110, such as, for example, part of a (digital) filter or decimation filter. The controller 120 of the electrical circuit 100 is arranged such that the same receives a signal sent by the output of the signal processing chain 110 and is coupled to the integrator 112 by means of a control channel. After having explained the circuit topology of the circuit 100, the functionality of the same will be addressed below.

For the following explanation, it is assumed that the signal processing chain 110 is a signal processing chain configured to perform an analog-to-digital transformation, wherein, however, it should be noted that also different kinds of signal processing chains with an integrator 112 are conceivable. In the present signal processing chain 110, an electrical input signal or, to be exact, an analog signal, like, e.g., a sinusoidal signal, is received through the input 100e with a fundamental wave of, e.g., 16⅔ Hz. The fundamental wave is determined by the period and may, for example, be between 5 Hz and 50 kHz. This signal is now fed to the circuit components of the signal processing chain 110, like, e.g., the comparator 114, which compares the signal to a threshold and grades it with 1 or 0. This binary signal is now integrated by the integrator 112 over a predetermined integration time T. This integration time T determines the effective measurement duration based on the system clock. As already noted above, the integrator 112 may also be part of the optional decimation filter (e.g. 1st order decimation filter). It is now possible by means of the digital decimation filter to convert a lowly resolved signal, e.g. a 1-bit digital signal with a high data rate (e.g. 0.4 MHz) such that it comprises a higher resolution (e.g. 4-bit, 16-bit or 24-bit) while comprising a lower renewal rate (e.g. 96 kHz or 48 kHz). The resulting sum of the output signals in the decimation filter represents the measurement value of the signal in the measurement interval. The digital signal converted in that manner (e.g. 4-bit output word) may now be output through the output 100a. As already explained above, in view of effects, like the occurrence of spectral side lines, a synchronous operation between the fundamental frequency of the measurement signal (cf. input 100e) and the oversampling frequency of the delta-to-sigma converter 110, which depends on the system frequency, is advantageous. According to the known approach, readjustment of the system frequency is accomplished in this case through a controllable oscillator with the help of a PLL.

However, according to the inventive idea, it has been recognized that it is also possible to adapt the measurement interval T such that an integer multiple, here, e.g., 64 times, of the duration of the measurement intervals fits exactly in a fundamental wave of the signal to be measured. For this, the effective duration of the measurement interval is adapted through the determination of the integration time T of the integrator 112 in the delta-to-sigma modulator 110 and, thus, the number of system clocks per measurement interval (that go into the measurement) to the period duration of the fundamental wave of the measurement signal. The adaptation is accomplished with the help of the controller 120, which analyzes the signal output by the signal processing chain 110 and outputs a control signal derived from the output signal (cf. output 100a), for controlling the integration duration T through the control channel based on the analysis result. Thus, the above mentioned effects may be avoided by the synchronization of the integration duration T to the fundamental frequency of the measurement signal (cf. input 100e), while an adaptation of the system clock frequency is not necessary. In this respect, the entire regulating structure, which manages without a controllable oscillator and is based on a constant system clock, is simplified. In particular, very highly resolved measurements may be realized without additional effort of a controllable oscillator. This has a positive effect on the system complexity and leads to a minimization of the circuit size.

As already indicated above, the principle described is not only applicable to sigma-to-delta converters but also transferable to further electrical circuits which realize the synchronization of the circuit to the signal to be processed no longer by varying the system clock but by influencing the integration time T of the integrator by external means or by means of a controller. The associated method will be explained hereinafter in conjunction with FIG. 1b.

Figure 1B:
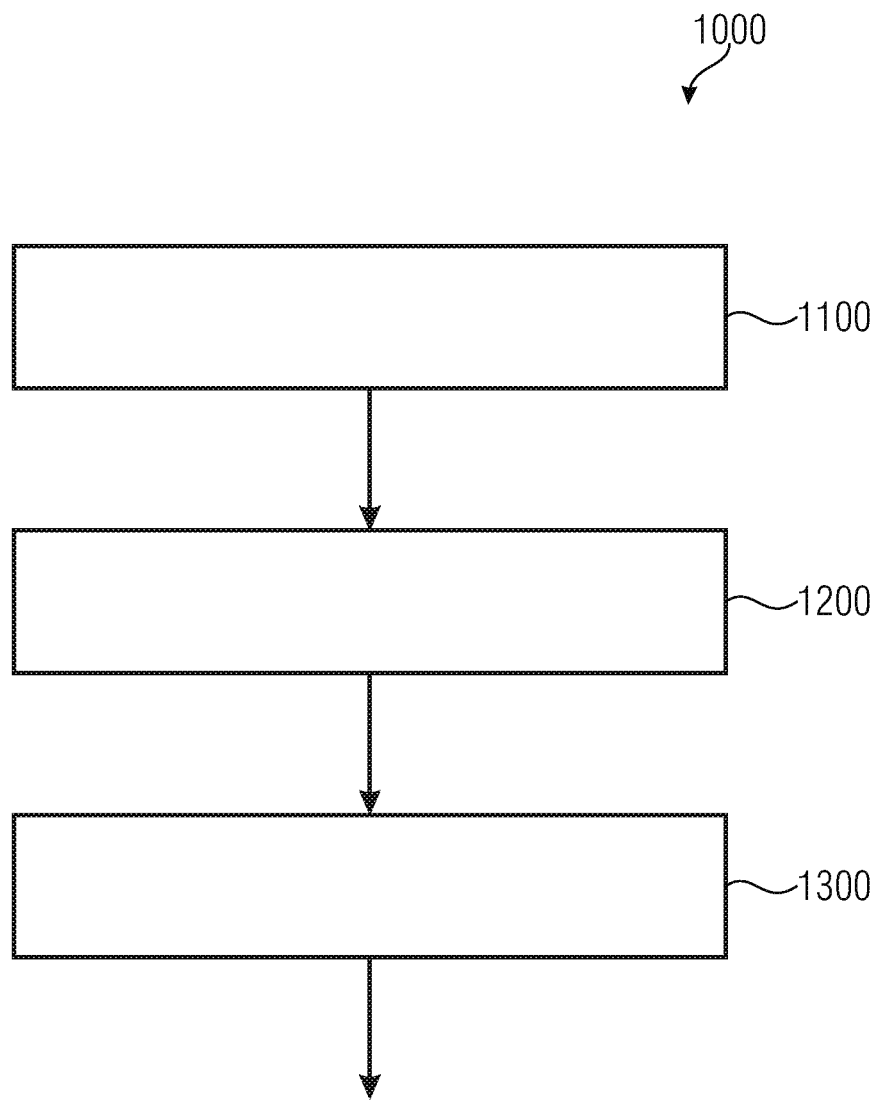

FIG. 1b shows a flow chart 1000 comprising three fundamental steps 1100, 1200 and 1300. The first fundamental step 1100 includes integrating the input signal over the integration time T by means of an integrator 112 comprised in the signal processing chain 110. In a next step 1200, the signal output by the signal processing chain 110 is received by the controller so that, depending on same, the integration time T may be adapted (cf. step 1300). The adaptation of the integration time T may be accomplished, for example, by means of a phase error 4 detected in step 1200. Same is adapted to the fundamental wave of the input signal (cf. 100e of the signal processing chain 110). According to embodiments, this is accomplished such that the period of the fundamental wave of the input signal is an integer multiple of the integration time T.

Figure 2:
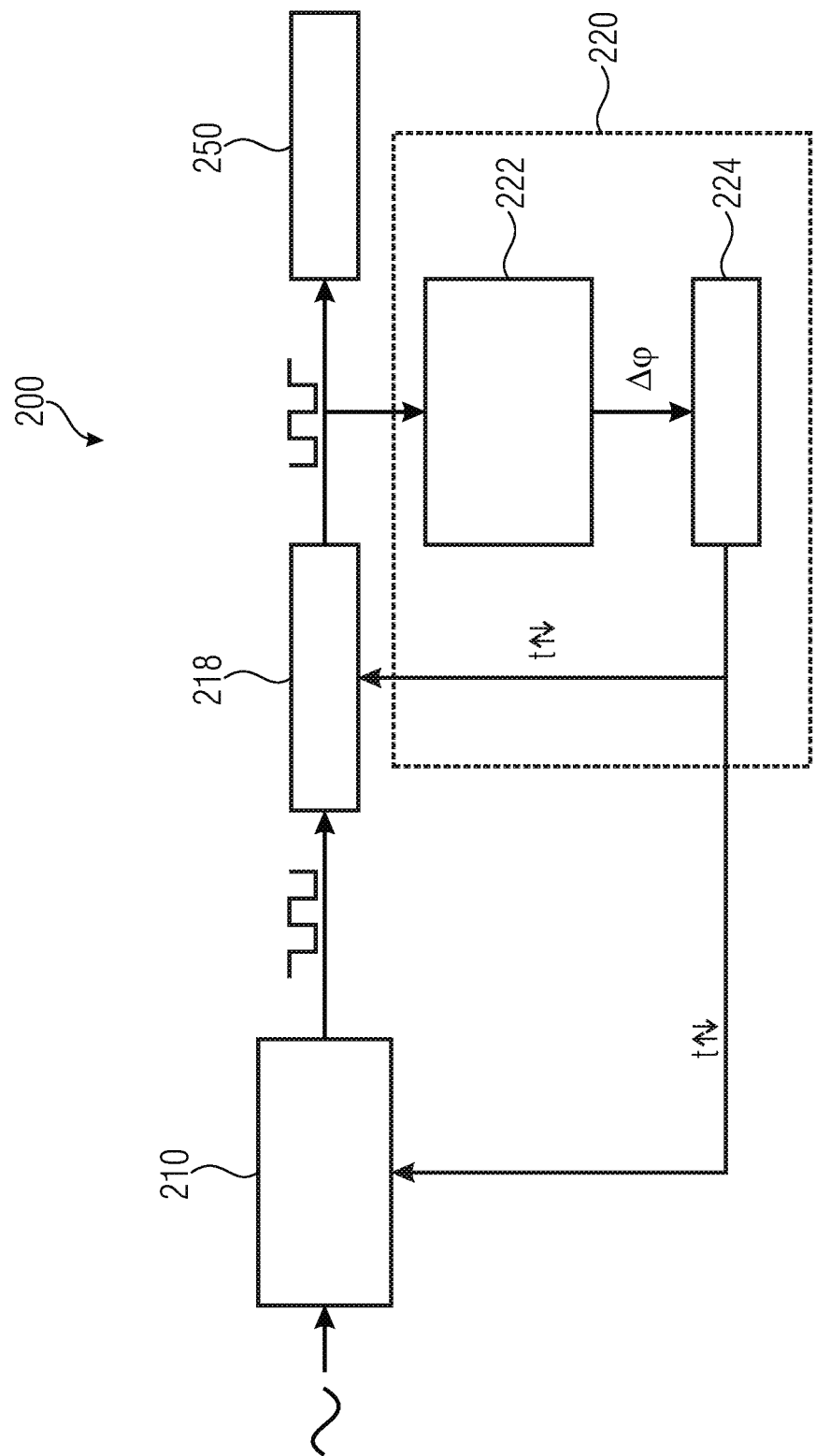
FIG. 2 shows a schematic block circuit diagram of an electrical circuit with an analog-to-digital conversion and a controller according to a further embodiment.
Figure 3:
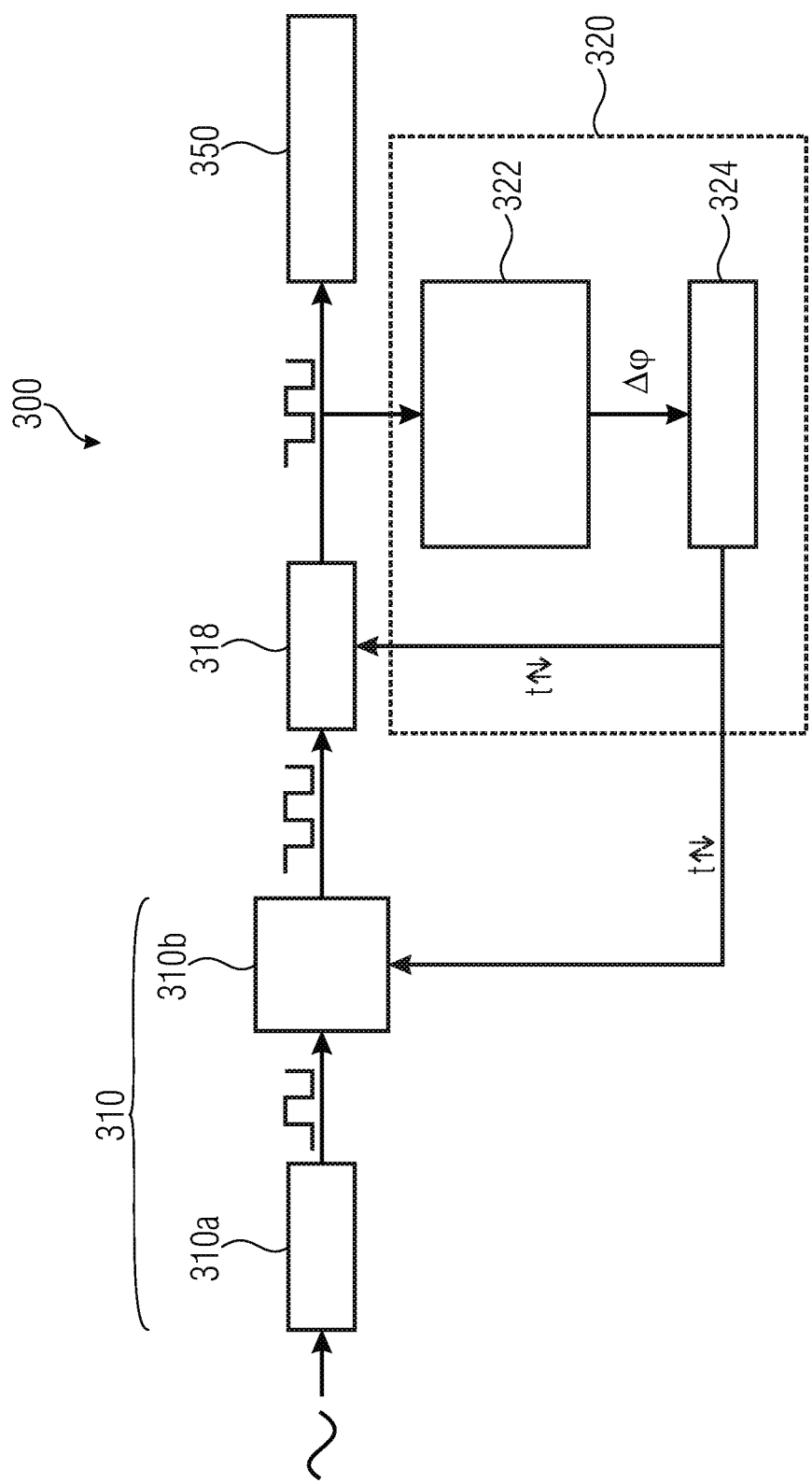
FIG. 3 shows a schematic block diagram of an electrical circuit with a decimation filter and a controller according to a further embodiment.

Referring to FIGS. 2 and 3, further specific embodiments, especially with focus on the controller, will now be explained.

FIG. 2 shows an electrical circuit 200 comprising an analog-to-digital converter 210, which also includes an integrator (not illustrated) and is, therefore, denoted in the following as integrating analog-to-digital converter (I-ADU) 210. The integrating analog-to-digital converter 210 is connected to an analog signal source (not illustrated) on the input site and to a digital post-processing stage 218 and further signal process 250 on the output side. The post-processing stage 218 may include, for example, a division formation element and is further connected, on the one hand, to the signal processor 350 on the output site and to the controller 220.

In this embodiment, the controller 220 includes a signal analyzer 222, like, e.g., a phase discriminator, and an integration time regulator 224 for regulating the integration time T, like, for example, a PLL regulator coupled between the post-processing stage 218 and the integrating analog-to-digital converter 210.

As in the previous embodiment, the integrating analog-to-digital converter 210 is configured to output a digital output signal based on an analog input signal, e.g. a sinusoidal signal. It is then fed to the post-processing stage 218 in digital form. Since the integration time T of the integrating analog-to-digital converter 210 is adapted through the controller 220, that is prolonged or shortened, the transfer ratio (gain) of the converter 210 changes. The background in this case is that the transfer ratio is proportional to the number of system clocks or samples per measurement interval. Reversely seen, it means that, since the integration time T or the effective measurement time is adapted, the number of system clocks detected also varies since the system clock itself remains constant. The consideration of this changed transfer ratio is accomplished by means of the post-processing stage 218, which, for example, divides the measurement results by the effective measurement duration or by number of the system clocks detected. Therefore, beside the integrating analog-to-digital converter 210, the post-processing stage 218 is also coupled to the controller 220 to receive the information on the adapted integration time T. The post-processing device 218 scales the digital measurement result accordingly and forwards the scaled result in a digital form to the signal processor 250 for further processing.

In this embodiment, the result scaled by the digital post-processor 218 is analyzed by the analyzer 222 of the controller 220. The analyzer 222 is configured to examine the data stream regarding phase errors δΦ. For sinusoidal or periodical signals, for example, every $n^{th}$ measurement value is taken and compared. Depending on this phase error signal φ, the adaptation of the integration time T by means of the integration time regulator 224 for adapting the integration time T is accomplished. The integration time regulator 224 may, for example, be realized as a PLL (phase-locked-loop) regulator and is configured to determine or adapt the integration time T of the integrator (not illustrated) of the integrating analog-to-digital converter 210. The control signal determining the integration time T is made available to the division formation element 218 through the circuit element 224.

FIG. 3 shows a further embodiment of an electrical circuit 300 which includes a signal processing chain 310 comprising an analog-to-digital converter 310a or comprising a sigma-to-delta modulator 310a and a decimation filter 310b. The signal processing chain 310 is coupled to a post-processing stage 318 which in turn includes a division formation element through which the signal is forwarded to the signal processing stage 350. As in the above embodiments, the output value of the decimation filter 310b is corrected by the post-processing stage 318 in accordance with the integration time T chosen or in accordance with the number of clock cycles. In detail, the correction is based on the fact that the output value of the decimation filter 310b corresponds mathematically to the integral over the input signal of the modulator 310a over the integration time Ti. The result is:

$$\text{Output value } (t_N) = \int_{t_N}^{t_N+T_i} U \, dt$$

Since the result is now proportional both to the amount of the signal in the period of integration T and to the duration of the period of integration, the amplitude of the output value may be corrected accordingly. As already explained above, this is accomplished by dividing or scaling by means of the division formation element in the post-processing stage 318. Referring to the relation between the integration duration T and the number of system clocks, it is to be noted that the system operates typically with the number of system clocks, which corresponds exactly to the respective decimation length of the current measurement value.

According to the embodiment of FIG. 2, the electrical circuit 300 includes a controller 320 with the signal analyzer 322 and the integration time regulator 324. In this embodiment, the integration is not accomplished in the analog-to-digital converter 310a but by means of the decimation filter 310b. Consequently, the integrator (integrator of 1st order with reset before every new measurement value) forms part of the decimation filter 310b. Therefore, in this embodiment, the controller 320 is coupled informationally to the integration filter 310b (and the division formation element 318) so that the controller 320 may output the control signal for controlling the integration time T to it by means of the integration time regulator 324.

Thus, in this incremental delta-to-sigma modulator 310a used with a downstream accumulator or a digital integrator 310b, the integration time T or the number of clock cycles, in other words the decimation length, over which the bit stream at the output of the modulator 310a is accumulated, is defined by the controller 320 or especially by the integration time regulator 324. According to embodiments, a so-called PLL regulation algorithm is used for this.

Even if in the above embodiments the sigma-to-delta converter has been discussed as a sigma-to-delta converter of 1st order, it is to be noted that the method described may also be applied to sigma-to-delta modulators of higher order (n=2, 3, . . . ). The same applies to the decimation filters, which were described as decimation filters of first order in the above discussion. For sigma-to-delta modulators of higher order or for decimation filters of higher order, the correction of the measurement values also depends on the decimation length. The correction factor is then calculated as a function of the decimation length and the structure of the sigma-to-delta modulator or the decimation filter.

Referring to FIG. 1, it should be noted that the delta-to-sigma modulator 110 (1st order) may comprise a (4-bit) return so that it is operable in an incremental mode, that is with reset after every conversion. In this case, typically every conversion is started with a decimation filter occupied with 0. The entire process is started anew with every system clock so that with every system clock the 4-bit output word of the modulator 110 is added up until the integration time T has run out.

According to alternative embodiments, the above described method is also applicable to further electrical circuits in which the effective measurement duration is adjustable by means of signal integration. Examples of this are analog-to-digital converters, like, e.g., slope converters, dual slope converters or multi-slope converters. Furthermore, the application of this principle is also conceivable in other integrating converters, like, for example, digital-to-digital converters (on a sigma-to-delta basis) or digital-to-analog converters (on a sigma-to-delta basis).

Although some aspects were described in conjunction with a device, it is to be understood that these aspects also represent a description of the corresponding method so that a block or a component of a device are also to be understood as a corresponding step of the method or as a feature of a step of the method. Similarly, aspects that have been described in conjunction with or as a method step also represent a description of a corresponding block or detail or function of a corresponding device. Some or all of the method steps may be performed by a hardware apparatus (or using a hardware apparatus) such as a microprocessor, a programmable computer or an electronical circuit. In some embodiments, some or more of the most important method steps may be performed by such an apparatus.

Some embodiments according to the invention also include a data carrier comprising electronically readable control signals which are capable of cooperating with a programmable computer system such that one of the methods described herein is performed.

Generally, embodiments of the present invention may be implemented as a computer program product with a program code, wherein the program code is operative to perform a method when the computer program product runs on a computer.

The program code may, for example, also be stored on a machine-readable carrier.

Other embodiments include the computer program for performing one of the methods described herein, wherein the computer program is stored on a machine-readable carrier.

In other words, an embodiment of the method according to the invention is, therefore, a computer program comprising one of the methods described herein when the computer program runs on a computer.

A further embodiment of the methods is therefore a data carrier (or a digital storage medium or a computer-readable medium) on which the computer program for performing one of the methods described herein is recorded.

A further embodiment of the method according to the invention is therefore a data stream or a sequence of signals respectively representing a computer program for performing one of the methods described herein. The data stream or the sequence of signals may, for example, be configured to be transferred via a data communication connection, for example, via the internet.

A further embodiment includes a processing device, for example, a computer or a programmable logic component configured or adapted to perform one of the methods described herein.

A further embodiment includes a computer on which the computer program for performing one of the methods described herein is installed.

A further embodiment according to the invention includes a device or a system configured, to transfer a computer program for performing at least one of the methods described herein to a receiver. The transfer may be accomplished, for example, electronically or optically. A receiver may, for example, be a computer, a mobile device, a storage device or a similar device. The device or the system may, for example, include a file server for transferring the computer program to the receiver.

In some embodiments, a programmable logic component (for example a field programmable gate array, FPGA) may be used to perform some or all functionalities of the methods described herein. In some embodiments, a field programmable gate array may cooperate with a microprocessor to perform one of the methods described herein. Generally, in some embodiments, the methods are performed by any hardware device. This may be a general purpose hardware such as a computer processor (CPU) or a hardware specific to the method, for example an ASIC.

While this invention has been described in terms of several embodiments, there are alterations, permutations, and equivalents which fall within the scope of this invention. It should also be noted that there are many alternative ways of implementing the methods and compositions of the present invention. It is, therefore, intended that the following appended claims be interpreted as including all such alterations, permutations and equivalents as fall within the true spirit and scope of the present invention.

The invention claimed is:

1. An electrical circuit comprising:
   a signal processing chain comprising an integrator configured to integrate an input signal over an integration time; and
   a controller connected to a signal output of the signal processing chain to receive and evaluate an output signal of the signal processing chain and configured to adapt the integration time based on the output signal, wherein the controller adapts the integration time such that a period of the fundamental wave of the input signal is an integer multiple of the mean integration time.

2. An electrical circuit comprising:
   a signal processing chain comprising an integrator configured to integrate an input signal over an integration time; and
   a controller connected to a signal output of the signal processing chain to receive and evaluate an output signal of the signal processing chain and configured to adapt the integration time based on the output signal, wherein the controller adapts the integration time to achieve synchronization of at least 90% between the integration time and a fundamental wave of the input signal in consideration of a division factor between a system clock of the electrical circuit and the fundamental wave.

3. The electrical circuit according to claim 1, wherein the signal processing chain comprises a sigma-to-delta modulator.

4. The electrical circuit according to claim 3, wherein the sigma-to-delta modulator is of $n^{th}$ order with $n \geq 1$.

5. The electrical circuit according to claim 1, wherein the signal processing chain comprises a comparator coupled to the integrator.

6. The electrical circuit according to claim 1, wherein the signal processing chain comprises a filter and/or decimation filter which comprises the integrator.

7. An electrical circuit comprising:
   a signal processing chain comprising an integrator configured to integrate an input signal over an integration time; and
   a controller connected to a signal output of the signal processing chain to receive and evaluate an output signal of the signal processing chain and configured to adapt the integration time based on the output signal, wherein the circuit is connected to an oscillator or comprises the oscillator which outputs an oscillation signal of constant frequency to the signal processing chain.

8. An electrical circuit comprising:
   a signal processing chain comprising an integrator configured to integrate an input signal over an integration time; and
   a controller connected to a signal output of the signal processing chain to receive and evaluate an output signal of the signal processing chain and configured to adapt the integration time based on the output signal, wherein the integral of the output signal over the integration time is proportional to the integration time.

9. The electrical circuit according to claim 8, wherein the signal processing chain is coupled to a post-processing stage comprising a division formation element configured to divide the output signal of the signal processing chain by the integration time and to output a division value as a result.

10. The electrical circuit according to claim 9, wherein the controller is coupled to the post-processing stage.

11. An electrical circuit comprising:
    a signal processing chain comprising an integrator configured to integrate an input signal over an integration time; and
    a controller connected to a signal output of the signal processing chain to receive and evaluate an output signal of the signal processing chain and configured to adapt the integration time based on the output signal, wherein the controller comprises a phase discriminator configured to evaluate the output signal regarding phase errors, and wherein the controller adapts the integration time such that the phase errors are minimized.

12. An electrical circuit comprising:
    a signal processing chain comprising an integrator configured to integrate an input signal over an integration time; and
    a controller connected to a signal output of the signal processing chain to receive and evaluate an output signal of the signal processing chain and configured to adapt the integration time based on the output signal, wherein the integrator is reset by a control signal output by the controller so that the integrator forms a new measurement value without any impact from past measurement values.

13. An electrical circuit comprising:
    a signal processing chain comprising an integrator configured to integrate an input signal over an integration time; and
    a controller connected to a signal output of the signal processing chain to receive and evaluate an output signal of the signal processing chain and configured to adapt the integration time based on the output signal, wherein the controller comprises a phase-locked loop which outputs a control signal by which the integration time of the integrator is controlled.

14. The electrical circuit according to claim 1, wherein the signal processing chain is configured to supply a digital output signal based on an analog input signal.

15. A method for signal processing comprising:
    integrating an input signal over an integration time by means of a signal processing chain which comprises an integrator;
    receiving and evaluating an output signal of the signal processing chain; and
    adapting the integration time based on the output signal, wherein the signal processing chain comprises a sigma-to-delta modulator.

16. A non-transitory digital storage medium having a computer program stored thereon to perform a method for signal processing comprising:

integrating an input signal over an integration time by means of a signal processing chain which comprises an integrator;
receiving and evaluating an output signal of the signal processing chain; and
adapting the integration time based on the output signal, when said computer program is run by a computer.

* * * * *